United States Patent
Jairaj et al.

(10) Patent No.: US 12,111,725 B2
(45) Date of Patent: Oct. 8, 2024

(54) READ RETRY SCRATCH SPACE

(71) Applicant: Micron Technology, Inc., Boise, ID (US)

(72) Inventors: Rahul Mitchell Jairaj, Boise, ID (US); Mark A. Hawes, Boise, ID (US); Terry M. Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/111,280

(22) Filed: Feb. 17, 2023

(65) Prior Publication Data

US 2023/0205628 A1 Jun. 29, 2023

Related U.S. Application Data

(63) Continuation of application No. 16/960,527, filed as application No. PCT/US2019/013026 on Jan. 10, 2019, now Pat. No. 11,586,498.

(60) Provisional application No. 62/617,057, filed on Jan. 12, 2018.

(51) Int. Cl.
*G06F 11/10* (2006.01)
*G06F 11/07* (2006.01)
*G06F 11/14* (2006.01)
*G06F 11/30* (2006.01)

(52) U.S. Cl.
CPC ...... *G06F 11/1068* (2013.01); *G06F 11/0772* (2013.01); *G06F 11/1048* (2013.01); *G06F 11/1489* (2013.01); *G06F 11/3037* (2013.01)

(58) Field of Classification Search
CPC ........... G06F 11/1068; G06F 11/0772; G06F 11/1048; G06F 11/1489; G06F 11/3037

USPC .......................................................... 714/6.1
See application file for complete search history.

(56) References Cited

U.S. PATENT DOCUMENTS

| 11,586,498 B2 | 2/2023 | Jairaj et al. |
| 2009/0055698 A1 | 2/2009 | Resnick |
| 2014/0075241 A1 | 3/2014 | Oh et al. |
| 2015/0089278 A1 | 3/2015 | Patapoutian et al. |

(Continued)

FOREIGN PATENT DOCUMENTS

| CN | 101681281 | 3/2010 |
| CN | 111684529 A | 9/2020 |
| WO | WO-2019140074 A1 | 7/2019 |

OTHER PUBLICATIONS

U.S. Appl. No. 16/960,527 U.S. Pat. No. 11,586,498, filed Jul. 7, 2020, Read Retry Scratch Space.

(Continued)

*Primary Examiner* — Yair Leibovich
(74) *Attorney, Agent, or Firm* — Schwegman Lundberg & Woessner, P.A.

(57) ABSTRACT

Devices and techniques to recover data from a memory device are disclosed, including recovering data corresponding to a detected error in data stored on a memory array corresponding to a memory operation using one of a set of read offset values and loading the one of the set of read offset values used to recover data corresponding to the detected error in a temporary storage of the memory array as a custom read offset value for a subsequent memory operation. The temporary storage of the memory array can include a scratch space of the memory array separate from read retry offset registers of the memory device.

20 Claims, 9 Drawing Sheets

(56) References Cited

U.S. PATENT DOCUMENTS

| 2016/0117220 | A1 | 4/2016 | Chen et al. |
| 2017/0236592 | A1 | 8/2017 | Alhussien et al. |
| 2017/0249206 | A1 | 8/2017 | Jeong et al. |
| 2017/0371743 | A1* | 12/2017 | Kalamatianos ..... G06F 11/1641 |
| 2018/0225042 | A1* | 8/2018 | Chen .................. G06F 11/1068 |
| 2020/0371876 | A1 | 11/2020 | Jairaj et al. |

OTHER PUBLICATIONS

"Chinese Application Serial No. 201980011262.9, Office Action mailed Mar. 25, 2023", with machine English translation, 21 pages.

"Chinese Application Serial No. 201980011262.9, Response filed Jul. 27, 2023 to Office Action mailed Mar. 25, 2023", with English claims, 18 pages.

"International Application Serial No. PCT/US2019/013026, International Preliminary Report on Patentability mailed Jul. 23, 2020", 9 pgs.

"International Application Serial No. PCT/US2019/013026, International Search Report mailed Apr. 29, 2019", 3 pgs.

"International Application Serial No. PCT/US2019/013026, Written Opinion mailed Apr. 29, 2019", 7 pgs.

"Loader", Wikipedia, [Online] Retrieved from the internet: <https://en.wikipedia.org/wiki/Loader_(computing)>, (2022).

"Scratch Space", Wikipedia, [Online]. Retrieved from the Internet: <https://en.wikipedia.org/wiki/Scratch_space>, (2021), 1 pg.

* cited by examiner

| SUBFEATURE PARAMETER | OPTIONS | DQ7 | DQ6 | DQ5 | DQ4 | DQ3 | DQ2 | DQ1 | DQ0 | VALUE | NOTES |
|---|---|---|---|---|---|---|---|---|---|---|---|
| P1 | | | | | | | | | | | |
| READ RETRY | DISABLE (DEFAULT) | 0 | 0 | 0 | 0 | 0 | 0 | 0 | 0 | 00000000b | |
| | OPTION 1 | 0 | 0 | 0 | 0 | 0 | 0 | 0 | 1 | 00000001b | |
| | OPTION 2 | 0 | 0 | 0 | 0 | 0 | 0 | 1 | 0 | 00000010b | |
| | OPTION 3 | 0 | 0 | 0 | 0 | 0 | 0 | 1 | 1 | 00000011b | |
| | OPTION 4 | 0 | 0 | 0 | 0 | 0 | 1 | 0 | 0 | 00000100b | |
| | - | - | - | - | - | - | - | - | - | - | |
| | - | - | - | - | - | - | - | - | - | - | |
| | - | - | - | - | - | - | - | - | - | - | |
| | OPTION 14 | 0 | 0 | 0 | 0 | 1 | 1 | 1 | 0 | 00001110b | |
| | OPTION 15 | 0 | 0 | 0 | 0 | 1 | 1 | 1 | 1 | 00001111b | |
| | SCRATCH SPACE #1 | 0/1 | 0 | 0 | 1 | 0 | 0 | 0 | 0 | 00010000b | CUSTOM RR1 |
| | SCRATCH SPACE #2 | 0/1 | 0 | 1 | 0 | 0 | 0 | 0 | 0 | 00100000b | CUSTOM RR2 |
| | SCRATCH SPACE #1 + CORRECTIVE READ | 0 | 0 | 0 | 1 | 1 | 0 | 0 | 0 | 00011000b | CUSTOM RR1+CR |
| | SCRATCH SPACE #2 + CORRECTIVE READ | 0 | 0 | 1 | 0 | 1 | 0 | 0 | 0 | 00101000b | CUSTOM RR2+CR |
| | RESERVED | - | - | - | - | - | - | - | - | - | |
| P2 | | | | | | | | | | | |
| RESERVED | | 0 | 0 | 0 | 0 | 0 | 0 | 0 | 0 | 00h | |
| P3 | | | | | | | | | | | |
| RESERVED | | 0 | 0 | 0 | 0 | 0 | 0 | 0 | 0 | 00h | |
| P4 | | | | | | | | | | | |
| RESERVED | | 0 | 0 | 0 | 0 | 0 | 0 | 0 | 0 | 00h | |

FIG. 5

READ RETRY SCRATCH SPACE

PRIORITY APPLICATION

This application is a continuation of U.S. application Ser. No. 16/960,527, filed Jul. 7, 2020, which is a U.S. National Stage Application under 35 U.S.C. 371 from International Application No. PCT/US2019/013026, filed Jan. 10, 2019, published as WO 2019/140074, which claims the benefit of priority to U.S. Application Ser. No. 62/617,057, filed 12 Jan. 2018, all of which are incorporated herein by reference in their entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each memory cell in a memory array can be programmed individually or collectively to one or a number of programmed states. For example, a single-level cell (SLC) can represent one of two programmed states (e.g., 1 or 0), representing one bit of data. In other examples, memory cells can represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 illustrates an example Read Retry Scratch Space feature table.

DETAILED DESCRIPTION

Figure 1:
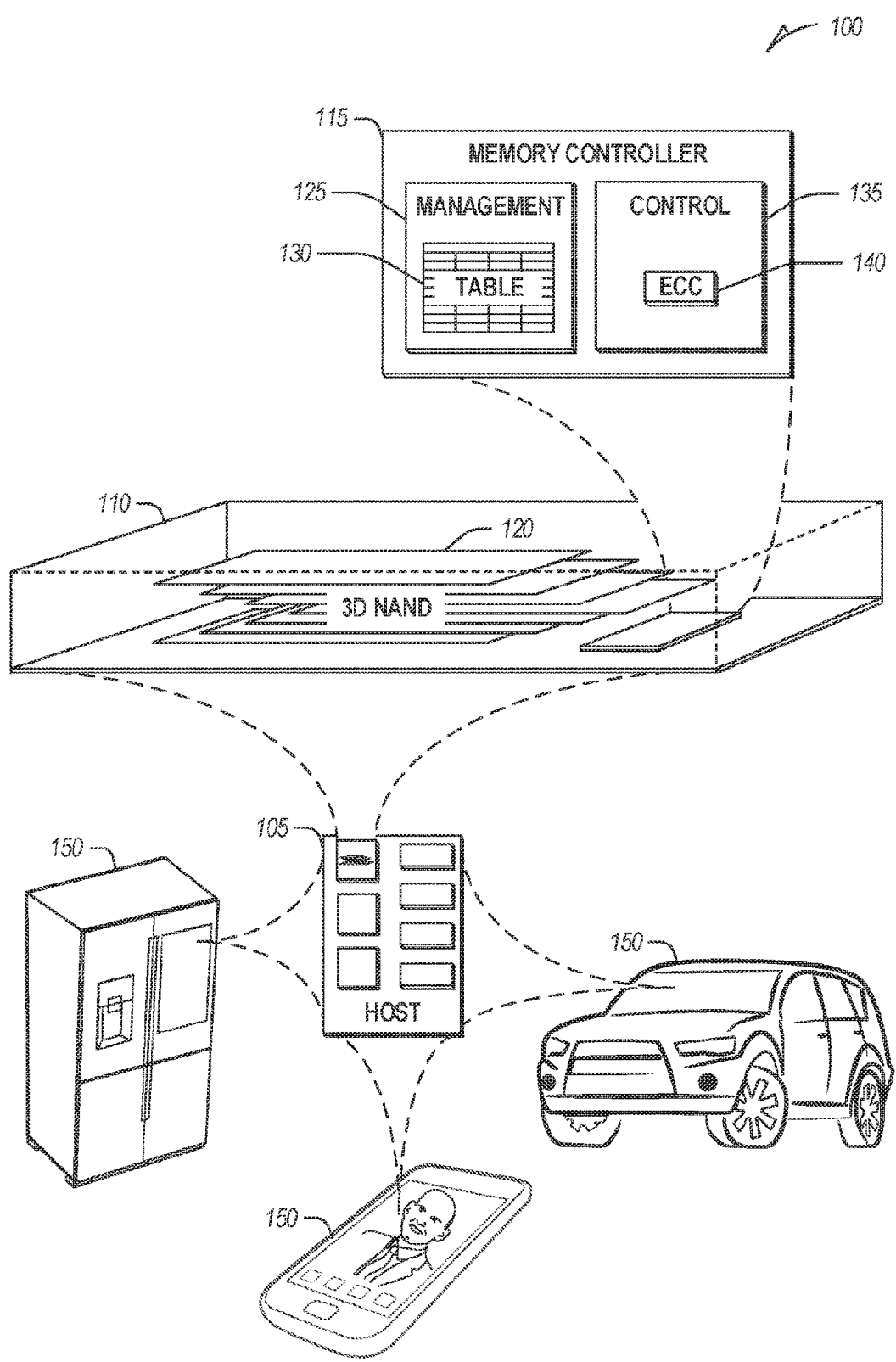
FIG. 1 illustrates an example of an environment including a memory device.

When excessive error correction code (ECC) errors are detected during a read operation, such as a Read Page or other read command associated with a read request, in response to a read disturb error, read distribution errors (e.g., within a page), or one or more other errors, one or more Read Retry options can be used to recover corrupted data, such as using an ECC code word. When an ECC fail occurs in one or more data code words, a host can buffer the data from the good data code words, and re-read the page using one or more Read Retry options, such as defined by a Read Retry flow chart, or using different sets of offsets. When code words that were previously beyond the ECC capability of the previous read can be recovered, the host can buffer that data with the other previously recovered data. In an example, a number or retries are available (e.g., one, two, or three or more) to recover the data in all of the code words within a NAND page associated with the Read Page command, for example, using different offsets or profiles.

The present inventors have recognized, among other things, Read Retry Scratch Space features that enable a user to provide custom, limited Read Retry changes to reduce the number of failed reads, or otherwise ease the burdens associated with Read Errors in memory devices, including decreasing latency, increasing speed of reads. In an example, custom, derived, learned, or otherwise known Read Retry features (e.g., offsets) can be input or programmed, for example, in scratch space of the memory device, and invoked without disrupting factory set Read Retry profiles and features. Such Read Retry Scratch Space features provide flexibility for a user to optimize Read Retry features (e.g., offsets) for specific use cases and scenarios within a system, or previously determined Read Retry offsets or thresholds for future use. In an example, such custom Read Retry features can supplement existing Read Retry options (e.g., such as the 16 illustrated in FIG. 5), without altering existing functionality, providing the benefits described above, without significantly affecting existing benefits and safeguards.

In an example, one or more prior auto read calibration (ARC) offsets can be loaded into the scratch space, avoiding the need to run ARC multiple times (e.g., in a given Read Page command, for each or multiple read operations, etc.). The Read Retry Scratch Space feature is faster than loading several Read Offset settings per read command, and can be invoked using a single SET FEATURE command to Feature Address (FA) 89h. Once a calibration setting or offset is found that works, such settings or offset can be stored in temporary memory, such as scratch space, reducing the need for trim manipulation or recalibration. Such feature can provide performance and latency improvements in contrast to existing Read Retry options, while avoiding the need to perform multiple set features commands (e.g., for applying read offsets to each read), providing improved quality of service (QoS) and, in certain examples, eliminating the need for trim manipulation.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die. In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 500 of FIG. 5.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
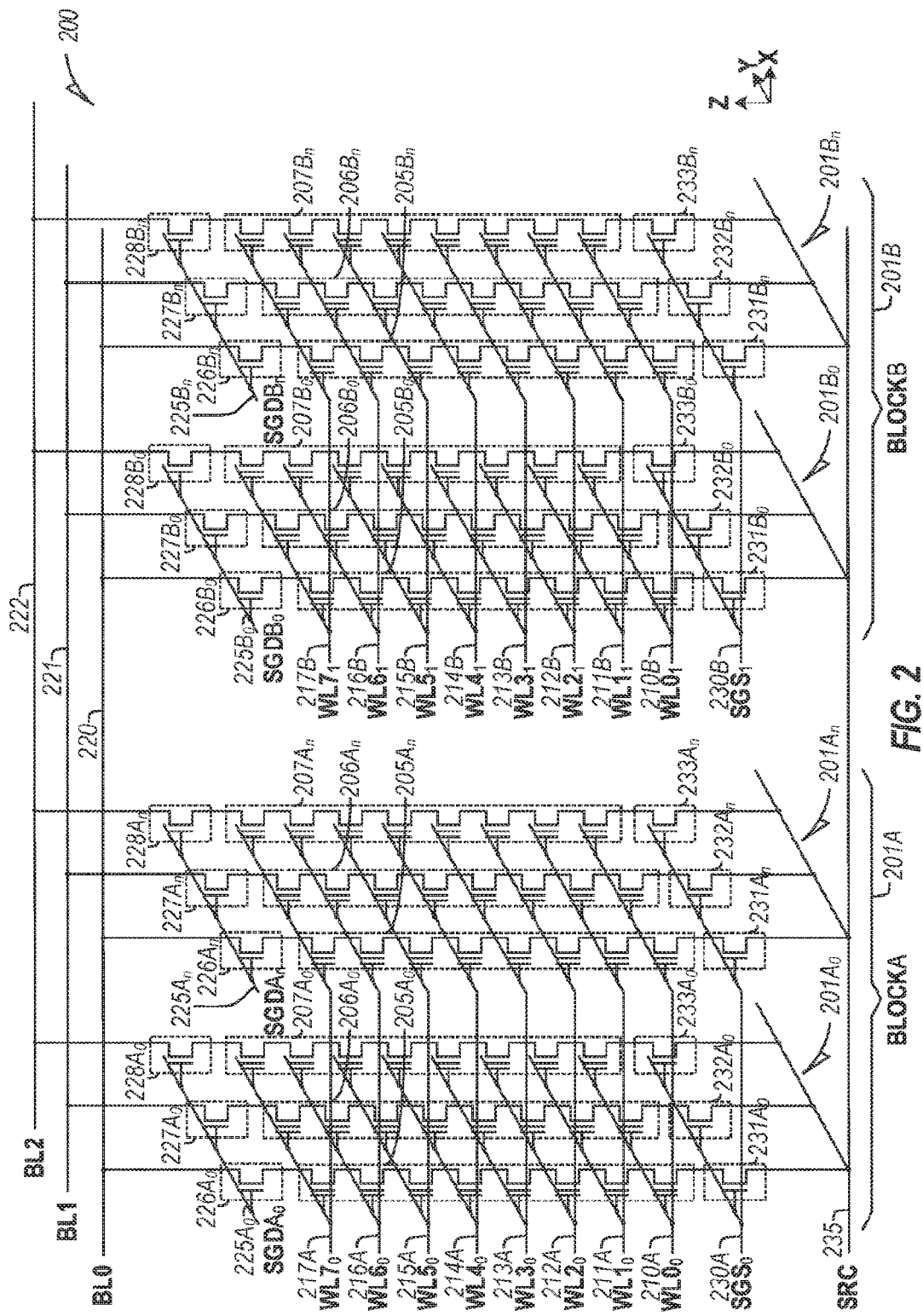
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line SGDA$_0$ $225A_0$, first-third $A_n$ SGD $226A_n$-$228A_n$ can be accessed using an $A_n$ SGD line SGDA$_n$ $225A_n$, first-third $B_0$ SGD $226B_0$-$228B_0$ can be accessed using an $B_0$ SGD line SGDB$_0$ $225B_0$, and first-third $B_n$ SGD $226B_n$-$228B_n$ can be accessed using an $B_n$ SGD line SGDB$_n$ $225B_n$. First-third $A_0$ SGS $231A_0$-$233A_0$ and first-third $A_n$ SGS $231A_n$-$233A_n$ can be accessed using a gate select line SGS$_0$ 230A, and first-third $B_0$ SGS $231B_0$-$233B_0$ and first-third $B_n$ SGS $231B_n$-$233B_n$ can be accessed using a gate select line SGS$_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
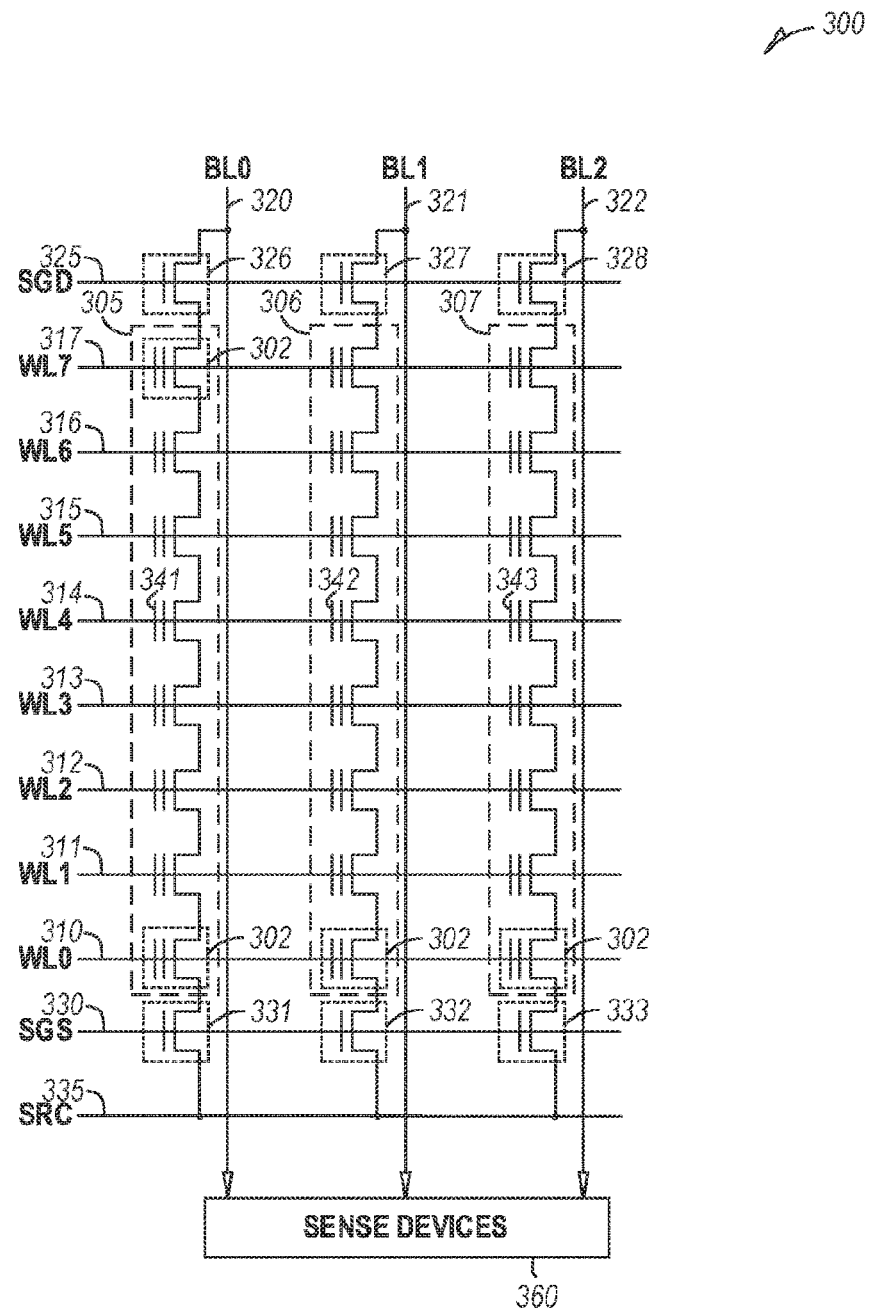

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-

BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
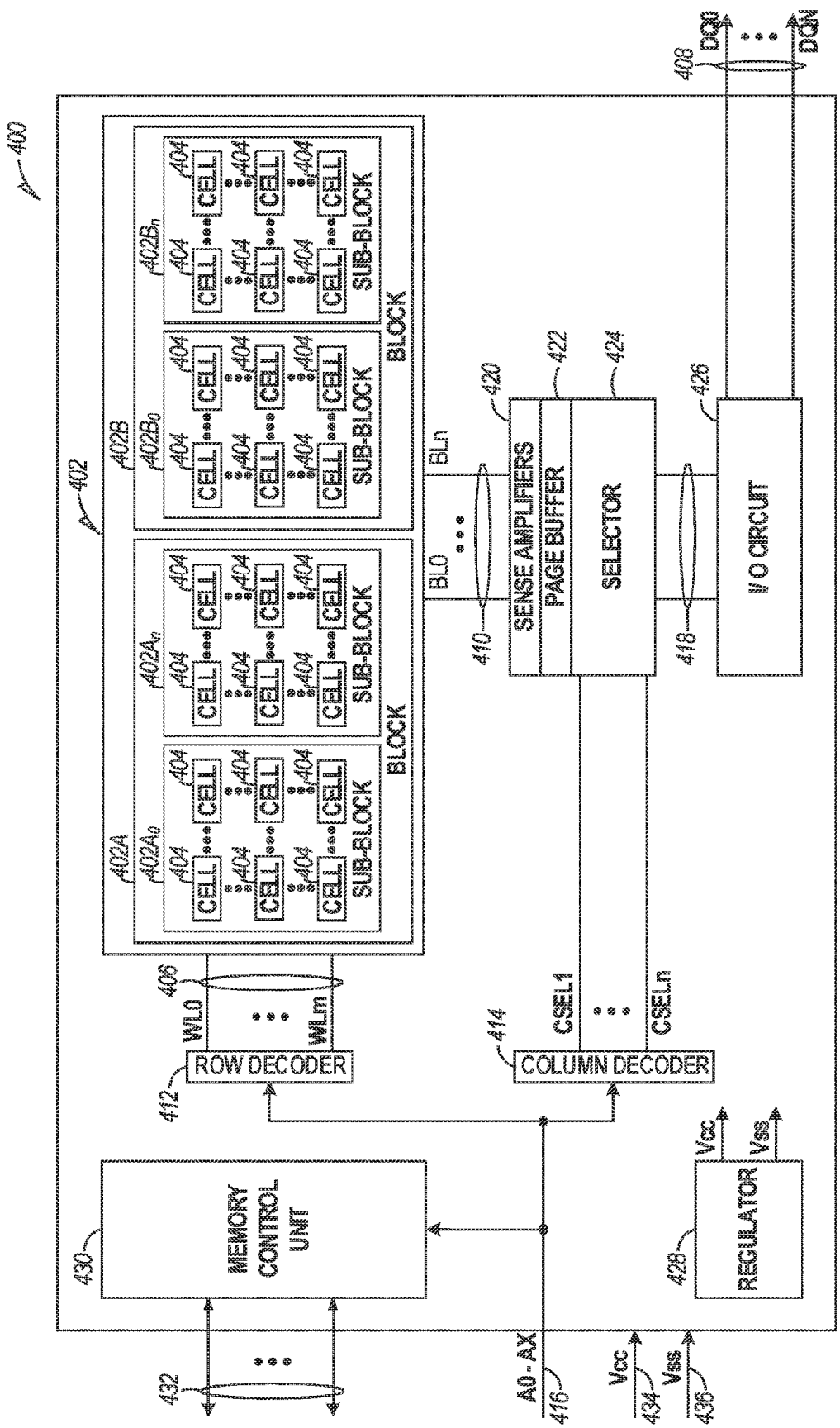
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

In an example, the Read Retry recovery process can be initiated in response to a detected ECC failure or error. During the recovery process, one or more of the following commands can be permitted: PAGE READ (00h-30h); PAGE READ MULTI-PLANE (00h-32h); COPYBACK READ (00h-35h); READ STATUS (70h); READ STATUS ENHANCED (78h); SET FEATURE (EFh); SET FEATURES by logical unit number (LUN) (D5h); GET FEATURE (EEh); or GET FEATURES by LUN (D4h).

With a read retry trim option enabled, a SET FEATURE (EFh) command can be issued to feature address 89h with Subfeature Parameter P1=01h, 02h, or 03h (or more if defined) to enable read retry option 1, 2, or 3 (or more if defined), respectively. After enabling the desired Read Retry option, the feature time ($t_{FEAT}$) follows normal data sheet specification for type and max time.

After data is written to a Read Retry feature address, subsequent read operations can use the trims associated with that value until either the Read Retry feature address is rewritten or the device is powered down or reset. However, in certain examples, Read Retry offsets are not applied during program pre-read operations. For a design that utilizes the program pre-read functionality, the Read Retry option would not need to be reset to 00b before issuing a second pass program operation with program pre-read function enabled.

In an example, a Read Retry Scratch Space feature can allow a number (e.g., one, two, or more) of additional Read Retry slots to be accessed by a user to load custom read offset values or Auto Read Calibration offsets to optimize read operations for specific data or conditions, typical known use situations, etc. In an example, custom read offset values can be loaded into Feature Address (FA)=A0h-D9h (Refer to the FA=A0h-D9h section for information about the appropriate registers for each design) register values. A Set Feature (FA=89h P1[7]=1) command can be issued to load the read offset data from the A0h-D9h registers and populate the Read Retry scratch space slots with the values. In an example, after the user slots are loaded, the A0h-D9h register values can continue with the previously loaded values (e.g., they will not be cleared automatically).

FIG. 5 illustrates an example Read Retry Scratch Space feature table 500 at Feature Address 89h. The Read Retry Scratch Space features (e.g., Custom RR1 and Custom RR2) can be found in Subfeature Parameter P1 with various options (e.g., Disable, Option 1-15, etc.) on values on input/out pins (DQ0-7). Although illustrated in FIG. 5 with two Read Retry Scratch Space features, in other examples, a system, apparatus, method, or computer-readable medium can include one, two, or three or more Read Retry Scratch Space features.

In FIG. 5, four new customizable Read Retry features are illustrated, two custom Read Retry features (custom RR1/RR2) and two custom Read Retry features with Corrective Read (custom RR1/RR2+CR). In this example, a user can load values into the first and second custom Read Retry features, with Corrective Read options populated by the memory device depending on the first and second custom Read Retry features. In other examples, more or less custom Read Retry features can be included, e.g., in scratch space (space in memory dedicated for temporary storage).

In an example, offsets can be loaded into Scratch Space #1 (P1=10h) and Scratch Space #2 (P1=20h) to optimize specific read requirements without disturbing the existing Read Retry options (e.g., P1 option 1 to 7). The Read Retry Scratch Space feature can improve system performance by reducing the need for issuing multiple Set Feature commands to change individual read offset registers. Only one Set Feature command would be needed to change the entire set of read offset voltage values. Further, such custom offsets can reduce the need for frequent calibration, and enable a user to account for known or anticipated conditions in a more efficient (time and resources) manner.

In addition to such custom offsets, a Corrective Read can be performed. Selecting Scratch Space #1+CR (P1=18h) or Scratch Space #2+CR (P1=28h) in Subfeature Parameter P1 could allow the user to perform Corrective Read with the offset values loaded into Scratch Space #1 and Scratch Space #2. These spare Read Retry registers would be set to zero as the default factory setting.

In an example, a custom read offset values (e.g., Set FA=89h P1[7]=1) cannot be loaded with any other Read Retry options than Scratch Space #1 (P1=10h) or Scratch Space #2 (P1=20h). The Read Retry values for any other Read Retry options may, in certain examples, not be changed if A=89h P1[7]=1.

After the read offset values are loaded with Set Feature FA=89h P1[7]=1, the next read will be performed using the loaded Read Retry values. For example, if Scratch Space #1 (FA=89h P1=90h) is loaded, subsequent reads will use the Read Retry Settings for Scratch Space #1 until the Read Retry option is changed via FA=89h. The Read Retry settings will not be applied to program pre-reads.

In an example, one or more of the following steps can be performed: (1) read levels can be characterized for specific data or use situations or conditions (e.g., by a user, a host, etc.) and optimal offset values for each read offset (A0h-D9h) can be determined; (2) the desired read offsets can be loaded into the appropriate A0h-D9h registers; (3) a Set Feature command can be issued with FA=89h and P1=90h to move the optimized offset values from the A0h-D9h registers to Scratch Space #1 read retry values; (4) in response, characterized read offsets can be loaded into Scratch Space #1; (5) if Read Offset values are not desired for subsequent reads, Read Offsets in FA=A0h-D9h can be reset using a Set Feature command; (6) a Set Feature command can be issued to feature address 89h with P1=10h to enable a custom read retry option for Scratch Space #1; and (7) when set feature 89h P1=18h is issued, a Corrective Read can be performed with the offset values loaded into Scratch Space #1, respectively. In other examples, one or more other steps can be performed, or a subset of the above, including steps to utilize Scratch Space #2, etc.

In an example, when Option 8 or greater is selected, a longer ready/busy (R/B #) time ($t_R$) can be observed due to Corrective Read functionality for those options. The Corrective Read technique can be activated by a controller to perform data correction due to floating-gate-to-floating-gate (FG-FG) interference internally in the memory during a read operation. The Corrective Read technique can detect if surrounding cells, acting as aggressors, have been programmed and adjusts the read level of a target cell accordingly. A channel calibration technique can use an algorithm executed in the memory to detect the read level that minimizes the bit error rate in a read operation. In certain examples, the longer $t_R$ does not apply for Read Retry options (e.g., custom RR1 and custom RR2, etc.) that do not invoke Corrective Read. In other examples, the Subfeature Parameter can include both, Read Retry options and Corrective Read functionality.

In an example, reset commands (e.g., FFh, FCh, and FAh) may not reset the Read Retry feature address 89h P1 data and disable Read Retry. A Hard Reset (FDh) command can reset the Read Retry feature address 89h to its default value for a target LUN. The Read Retry feature should not be used with the following commands: Read Parameter Page (ECh); Read Unique ID (EDh); and READ OTP page [00h-0030h).

In an example, FA 89h can be used to both set and use the custom Read Retry features. To set a custom Read Retry feature, FA 89h P1 DQ[7] and DQ[4] or DQ[5] should be "1". FA 89h P1 DQ[7] can be a "0" when invoking a custom Read Retry feature, but DQ[4] and DQ[5] can be set to a "1" depending on the custom Read Retry feature selected. FA 89h P1 DQ[3] can be set to a "1" to invoke any Read Retry with Corrective Read functionality.

In certain examples, other Read Retry options can be used, such as illustrated below in Table 1.

TABLE 1

Read Offset Feature Addresses - TLC (2-8)

| Feature Address | Wordline Type | Page Type | Applied Read Level | Description |
|---|---|---|---|---|
| A0h | MLC | Upper Page | rL1_2bpc | Read offset for level 1 (01) for fully LP & UP programmed pages from a 2bpc WL |
| A1h | MLC | Lower Page | rL2_2bpc | Read offset for level 2 (00) for fully LP & UP programmed pages from a 2bpc WL |
| A2h | MLC | Upper Page | rL3_2bpc | Read offset for level 3 (10) for fully LP & UP programmed pages from a 2bpc WL |
| A3h | Reserved | Reserved | Reserved | Reserved (Due to the 2-8 Programming Algorithm) |
| A4h | SLC | SLC Page | rSLC | Read Offset level for SLC only Pages |
| A5h | TLC | eXtra Page | rL1_3bpc | Read Offset for level 1 (011) for fully programmed pages from a 3bpc WL |
| A6h | TLC | Upper Page | rL2_3bpc | Read Offset for level 2 (001) for fully programmed pages from a 3bpc WL |
| A7h | TLC | eXtra Page | rL3_3bpc | Read Offset for level 3 (101) for fully programmed pages from a 3bpc WL |
| A8h | TLC | Lower Page | rL4_3bpc | Read Offset for level 4 (100) for fully programmed pages from a 3bpc WL |
| A9h | TLC | eXtra Page | rL5_3bpc | Read Offset for level 5 (000) for fully programmed pages from a 3bpc WL |
| AAh | TLC | Upper Page | rL6_3bpc | Read Offset for level 6 (010) for fully programmed pages from a 3bpc WL |
| ABh | TLC | eXtra Page | rL7_3bpc | Read Offset for level 7 (110) for fully programmed pages from a 3bpc WL |
| ACh | TLC open | Lower Page | rLP_3bpc | Read Offset for only LP programmed pages from a 3bpc WL |
| ADh | Reserved | Reserved | Reserved | Reserved (Due to the 2-8 Programming Algorithm) |
| AEh | Reserved | Reserved | Reserved | Reserved (Due to the 2-8 Programming Algorithm) |
| AFh | Reserved | Reserved | Reserved | Reserved (Due to the 2-8 Programming Algorithm) |

Figure 6:
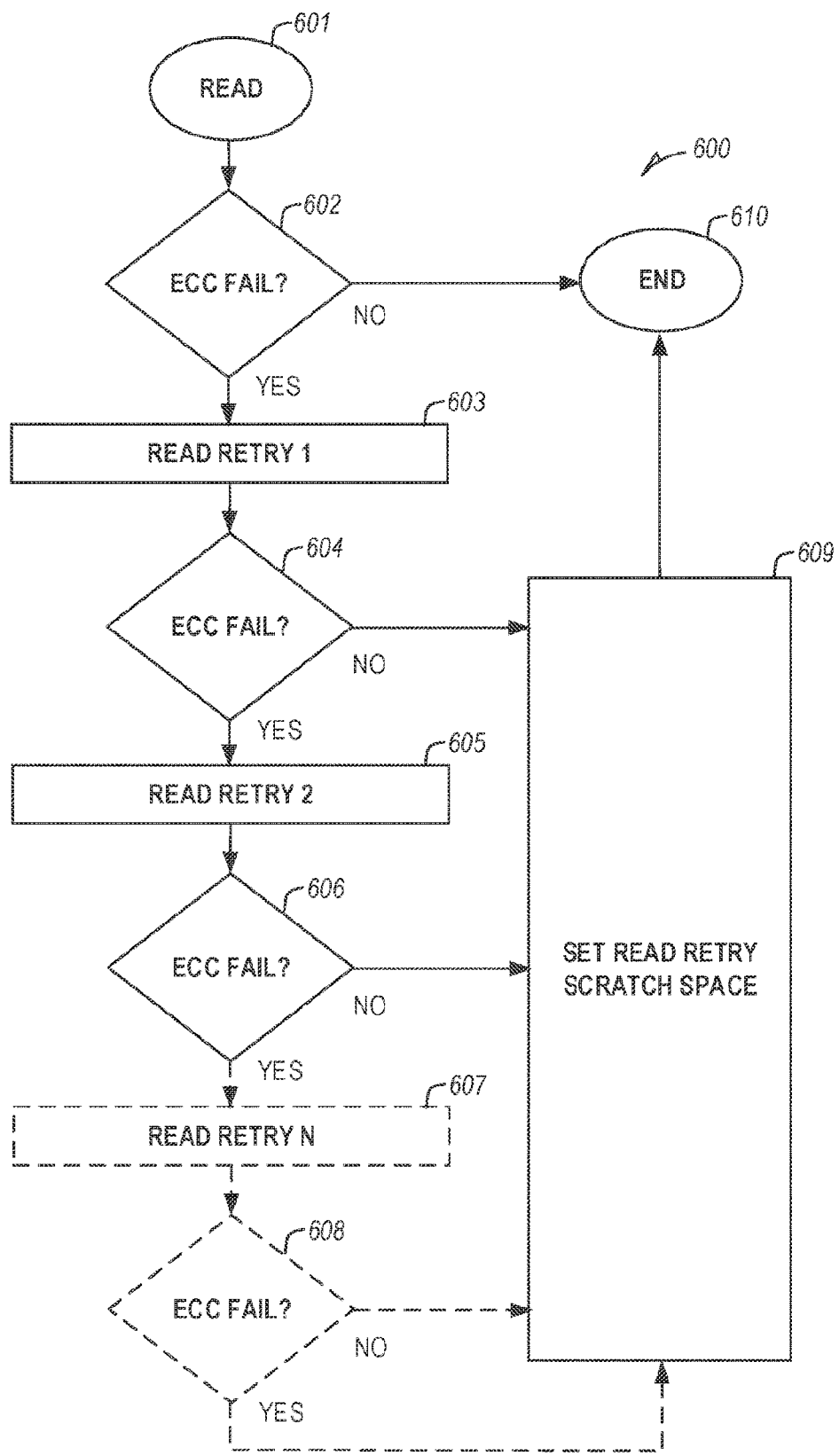
FIGS. 6-8 illustrate example methods of implementing Read Retry Scratch Space features using a host, a memory device, or a memory controller.
Figure 7:
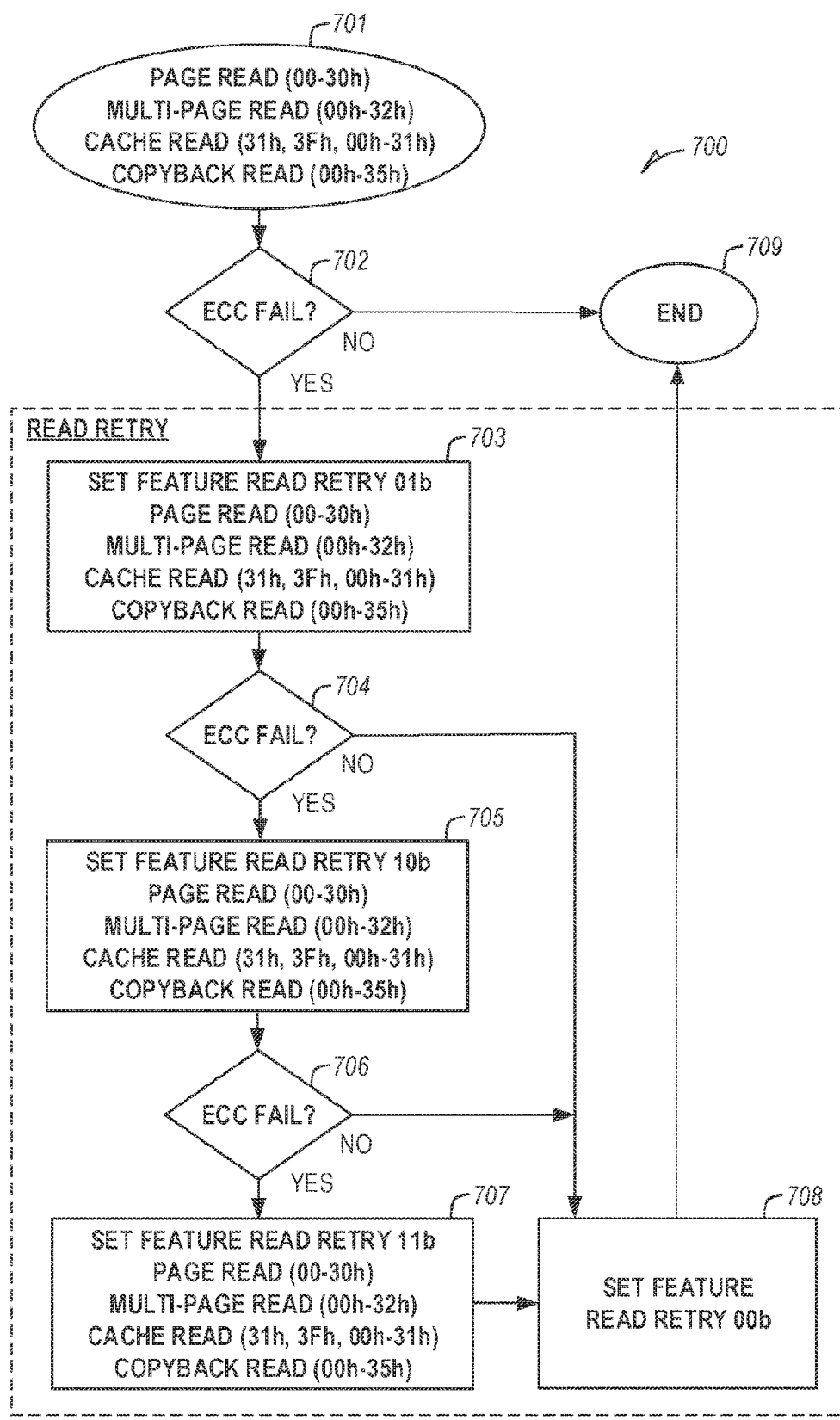
Figure 8:
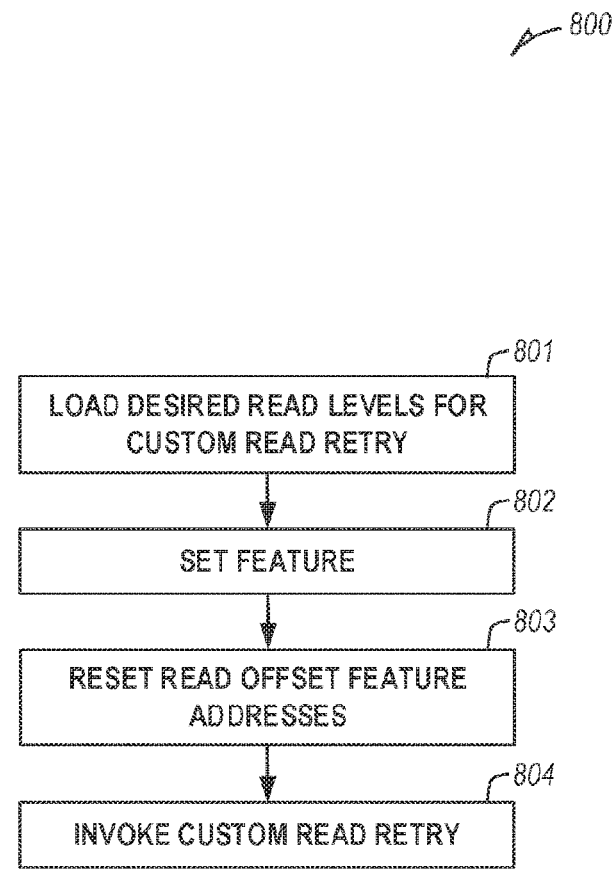

FIGS. 6-8 illustrate example methods 600, 700, 800 of implementing Read Retry Scratch Space features using a host, a memory device, or a memory controller.

FIG. 6 illustrates an example method 600 including performing a read command at 601. If an ECC error is detected (if ECC fails) at 602, a first Read Retry (Read Retry 1) can be performed at 603. If an ECC error is not detected at 602, the read was successful and the method 600 can end at 610.

If an ECC error is detected at 604, a second Read Retry (Read Retry 2) can be performed at 605. If an ECC error is not detected at 604, the read was successful. Following a successful Read Retry, the Read Retry Scratch Space feature can be set to the successful Read Retry at 609, and the method can end at 610. Once set, the Read Retry Scratch Space feature can be used on following reads, either for the initial read, or in the event of a detected ECC error. In other examples, the Read Retry Scratch Space feature can include one or more other Read Retry options (e.g., offsets, thresholds, settings, etc.).

If an ECC error is detected at 606, an nth Read Retry (Read Retry N) can be performed at 607. If an ECC error is not detected at 606, the read was successful. If an ECC error is detected at 608, the Read Retry Scratch Space feature can be updated to reflect that no Read Retry options corrected the ECC error. In certain examples, at the next read operation failure (e.g., ECC fail), instead of trying each Read Retry, the method can end at 610. In other examples, multiple Read Retry Scratch Space features can be set, or cycled through, in addition to the existing Read Retry features (e.g., ARC, etc.).

FIG. 7 illustrates an example method 700 including performing, at 701, one or more of a page read (00-30h), a multi-page read (00h-32h), a cache read (31h, 3Fh, 00h-31h), or a copyback read (00h-35h). If an ECC error is detected at 702, Read Retry can be performed, including in certain examples, setting or using a Read Retry Scratch Space feature, such as at 708, prior to the method end at 709.

If an ECC (or other) error is detected at 702, a first Read Retry can be performed at 703, including performing one or more of a Set Feature Read Retry 01b, a page read (00-30h), a multi-page read (00h-32h), a cache read (31h, 3Fh, 00h-31h), or a copyback read (00h-35h). If an ECC error is not detected at 702, the read was successful and the method can end at 709.

If an ECC (or other) error is detected at 704, a second Read Retry can be performed at 705, including performing one or more of a Set Feature Read Retry 10b, a page read (00-30h), a multi-page read (00h-32h), a cache read (31h, 3Fh, 00h-31h), or a copyback read (00h-35h). If an ECC error is not detected at 704, the read was successful and the method can continue to Set Feature Read Retry 00b at 708. The Read Retry Scratch Space feature can be set to the value of the Read Retry that provided the successful ECC option. In other examples, the Read Retry Scratch Space feature can include one or more other custom or desired offset, value, threshold, etc.

If an ECC error is detected at 706, a third Read Retry can be performed at 707, including performing one or more of a Set Feature Read Retry 11b, a page read (00-30h), a multi-page read (00h-32h), a cache read (31h, 3Fh, 00h-31h), or a copyback read (00h-35h). If the third Read Retry at 707 is the last preset Read Retry option, then the method can continue to Set Feature Read Retry 00b. In an example, one or more of the first, second, or third Read Retry can include a custom, user-defined Read Retry Scratch Space feature. In other examples, the first, second, or third Read Retry can include one or more standard or preset Read Retry options delivered by the manufacturer or defined by a user. In certain examples, more or less Read Retry options can be performed. If an ECC error is not detected at 706, the read was successful and the method can continue to Set Feature Read Retry 00b at 708 prior to the method end at 709.

FIG. 8 illustrates an example method 800 including using a Read Retry Scratch Space. At 801, desired Read Levels can be loaded into Read Offset registers (e.g., using Set Feature to A0h-ACh feature addresses) for a custom Read Retry in scratch space. At 802, the contents of the custom Read Retry can be populated, for example, by setting Set Feature 89h with P1=90h (DQ[7] and DQ[4]="1").

At 803, Read Offset Feature address (e.g., A0h-Ach, since the custom Read Retry in scratch space is loaded into the internal SRAM) can be reset. In certain examples, this step is required, and the user must Reset the Read Offset Feature to the custom Read Retry in scratch space.

At 804, the custom Read Retry can be invoked for future reads, such as by setting Set Feature 89h with P1=10h (DQ[4]="1"). In an example, the custom Read Retry in scratch space will be invoked until it is reset. The custom Read Retry can be reset using a Hard Reset (FDh) or a power cycle (similar to how preset Read Retry features behave).

In an example, $t_R$ with custom Read Retry (e.g., custom RR1/RR2) is going to be the same as $t_R$ with RR0-RR7. Similarly, the $t_R$ for custom Read Retry (e.g., custom RR1/RR2+Corrective Read) are going to be the same as RR8-15. In an example, range for custom Read Retry read levels is the same as the regular Read Retry range (e.g., ~+/−960 mV). Custom Read Retry features can have an initial setting of 00h.

Figure 9:
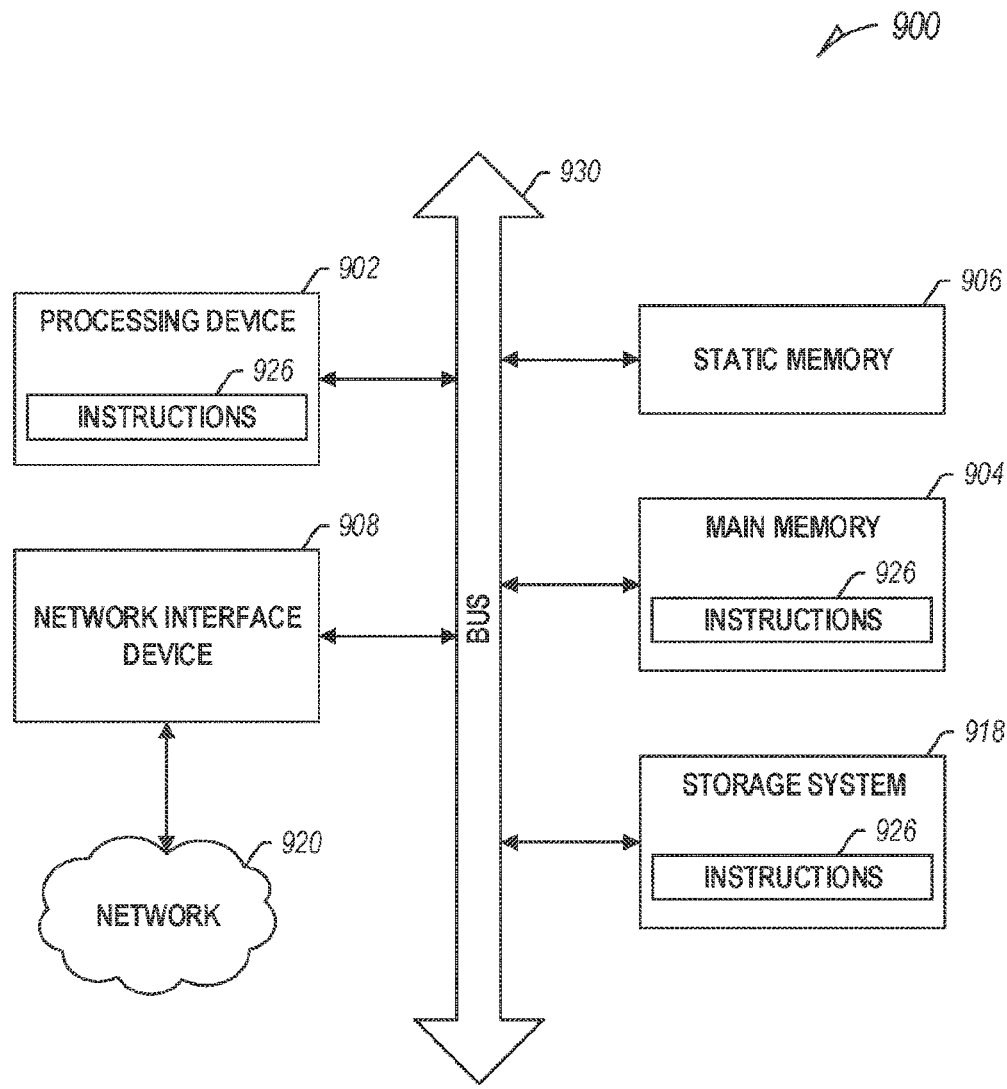
FIG. 9 is a block diagram illustrating an example of a machine upon which one or more embodiments may be implemented.

FIG. 9 illustrates a block diagram of an example machine 900 upon which any one or more of the techniques (e.g., methodologies) discussed herein may perform, such as triggering a CSAVE operation in a memory device (e.g., an NVDIMM) using a timer implemented using a memory controller of the NVDIMM. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in peer-to-peer (P2P) (or other distributed) network environment. The machine 900 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation.

Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 900 (e.g., the host 105, the storage system 110, etc.) may include a hardware processor 902 (e.g., a central processing unit (CPU), a graphics processing unit (GPU), a hardware processor core, or any combination thereof, such as a memory controller, etc.), a main memory 904 and a static memory 906, some or all of which may communicate with each other via an interlink (e.g., bus) 930. The machine 900 may further include a display unit, an alphanumeric input device (e.g., a keyboard), and a user interface (UI) navigation device (e.g., a mouse). In an example, the display unit, input device and UI navigation device may be a touch screen display. The machine 900 may additionally include a signal generation device (e.g., a speaker), a network interface device 908, and one or more sensors, such as a global positioning system (GPS) sensor, compass, accelerometer, or other sensor. The machine 900 may include an output controller, such as a serial (e.g., Universal Serial Bus (USB), parallel, or other wired or wireless (e.g., infrared (IR), near field communication (NFC), etc.) connection to communicate or control one or more peripheral devices (e.g., a printer, card reader, etc.).

The machine 900 may include a storage system (e.g., a machine-readable medium) on which is stored one or more sets of data structures or instructions 926 (e.g., software) embodying or utilized by any one or more of the techniques or functions described herein. The instructions 926 may also reside, completely or at least partially, within the main memory 904, within static memory 906, or within the hardware processor 902 during execution thereof by the machine 900. In an example, one or any combination of the hardware processor 902, the main memory 904, the static memory 906, or the storage system 918 may constitute a machine-readable medium. The term "machine-readable medium" may include a single medium or multiple media (e.g., a centralized or distributed database, or associated caches and servers) configured to store the one or more instructions 926.

The term "machine-readable medium" may include any medium that is capable of storing, encoding, or carrying instructions for execution by the machine 900 and that cause the machine 900 to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 926 (e.g., software, programs, an operating system (OS), etc.) or other data are stored on the storage system 918, can be accessed by the memory 904 for use by the processor 902. The memory 904 (e.g., DRAM) is typically fast, but volatile, and thus a different type of storage than the storage system 918 (e.g., an SSD), which is suitable for long-term storage, including while in an "off" condition. The instructions 926 or data in use by a user or the machine 900 are typically loaded in the memory 904 for use by the processor 902. When the memory 904 is full, virtual space from the storage system 918 can be allocated to supplement the memory 904; however, because the storage system 918 device is typically slower than the memory 904, and write speeds are typically at least twice as slow as read speeds, use of virtual memory can greatly reduce user experience due to storage device latency (in contrast to the memory 904, e.g., DRAM). Further, use of the storage system 918 for virtual memory can greatly reduce the usable lifespan of the storage system 918.

In contrast to virtual memory, virtual memory compression (e.g., the Linux™ kernel feature "ZRAM") uses part of the memory as compressed block storage to avoid paging to the storage system 918. Paging takes place in the compressed block until it is necessary to write such data to the storage system 918. Virtual memory compression increases the usable size of memory 904, while reducing wear on the storage system 918.

Storage systems optimized for mobile electronic devices, or mobile storage, traditionally include MMC solid-state storage systems (e.g., micro Secure Digital (microSD™) cards, etc.). MMC devices include a number of parallel interfaces (e.g., an 8-bit parallel interface) with a host, and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to improve, such as to fully enable virtual or augmented-reality devices, utilize increasing networks speeds, etc. In response to this demand, storage systems have shifted from parallel to serial communication interfaces. Universal Flash Storage (UFS) devices, including controllers and firmware, communicate with a host using a low-voltage signaling interface, such as a Scalable Low-Voltage Signaling (SLVS) interface with dedicated read/write paths, further increasing read/write speeds.

The instructions 926 may further be transmitted or received over a communications network 920 using a transmission medium via the network interface device 908 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 908 may include one or more physical jacks (e.g., Ethernet, coaxial, or phone jacks) or one or more antennas to connect to the communications network 920. In an example, the network interface device 908 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 900, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

In Example 1, subject matter (e.g., a memory device) configured to recover data from a memory array may comprise: a memory array having multiple blocks of memory cells; and a memory controller operably coupled to the memory array, the memory controller configured to perform operations comprising: receive a first read request; read data from the memory array corresponding to the first read request; determine if the read data corresponding to the first read request includes a detectable error; in response to a detected error in the read data corresponding to the first read request, recover data corresponding to the first read request using one of a set of read retry features; and load the one of the set of read retry features used to recover data corresponding to the first read request as a custom read retry feature in the memory device for a second read request subsequent to the first read request.

In Example 2, the subject matter of Example 1 may optionally be configured such that, to load the one of the set of read retry features, the memory controller performs operations comprising: load the one of the set of read retry features in a scratch space of the memory array.

In Example 3, the subject matter of any one or more of Examples 1-2 may optionally be configured such that the memory controller is configured to perform operations comprising: default to the custom read retry feature, if loaded, to recover data.

In Example 4, the subject matter of any one or more of Examples 1-3 may optionally be configured such that the set of read retry features includes a set of read retry offset settings.

In Example 5, the subject matter of any one or more of Examples 1-4 may optionally be configured such that, to recover data corresponding to the first read request, the memory controller performs operations comprising: determine an optimal read retry offset setting from the set of read retry offset settings to recover data in the read data corresponding to the first read request, and, to load the one of the set of read retry features, the memory controller performs operations comprising: load the determined optimal read retry offset setting to recover data in the read data corresponding to the first read request as the custom read retry feature.

In Example 6, the subject matter of any one or more of Examples 1-5 may optionally be configured such that the set of read retry features includes first and second read retry offset settings, wherein, to recover data corresponding to the first read request, the memory controller performs operations comprising: determine if one of the first and second read retry offset settings recovers the detected error, and wherein, to load the one of the set of read retry features, the memory controller performs operations comprising: load the determined one of the first and second read retry offset settings as a custom read retry feature In Example 7, the subject matter of any one or more of Examples 1-6 may optionally be configured such that the memory controller is configured to perform operations comprising: receive a second read request; read data from the memory array corresponding to the second read request; determine if the read data corresponding to the second read request includes a detectable error; in response to a detected error in the read data corresponding to the second read request, attempt to recover data corresponding to the second read request using the custom read retry feature before attempting to recover data using the set of read retry features.

In Example 8, subject matter (e.g., a memory device) configured to recover data from a memory array may comprise: a memory array having multiple blocks of memory cells; and a memory controller operably coupled to the memory array, the memory controller configured to perform operations comprising: store a custom read retry feature in a scratch space of the memory array; determine if read data corresponding to a read request includes a detectable error; and recover data from a detected error in the read data corresponding to the read request using the custom read retry feature stored in the scratch space of the memory array.

In Example 9, the subject matter of Example 8 may optionally be configured such that the memory controller is configured to perform operations comprising: receiving the custom read retry feature prior to storing the custom read retry feature in the scratch space of the memory array.

In Example 10, the subject matter of any one or more of Examples 8-9 may optionally be configured such that the memory controller is configured to perform operations comprising: determine an optimal read retry feature for read data associated with a first read command, wherein, to store the custom read retry feature, the memory controller is configured to perform operations comprising: store the determined optimal read retry feature for read data associated with the first read command as the custom read retry feature in the scratch space of the memory array, and wherein, to recover data from the detected error, the memory controller is configured to perform operations comprising: recover data from a detected error in read data associated with a second read command, subsequent to the first read command, using the custom read retry feature stored in the scratch space of the memory array.

In Example 11, the subject matter of any one or more of Examples 8-10 may optionally be configured such that to recover data from the detected error, the memory controller performs operations comprising: attempt to recover data from the detected error using the custom read retry feature before attempting to recover data from the detected error using one of a set of read retry features stored in registers separate from the scratch space of the memory array.

In Example 12, the subject matter of any one or more of Examples 8-11 may optionally be configured to include read retry offset registers, separate from the scratch space, configured to store a set of read retry offsets for error correction.

In Example 13, subject matter (e.g., a method) to recover data from a memory array may comprise: receiving a first read request at a memory controller; reading data from the memory array corresponding to the first read request; determining if the read data corresponding to the first read request includes a detectable error; recovering data, in response to a detected error in the read data corresponding to the first read request, using one of a set of read retry features; and loading, using the memory controller, the one of the set of read retry features used to recover data corresponding to the first read request as a custom read retry feature in the memory device for a second read request subsequent to the first read request.

In Example 14, the subject matter of Example 13 may optionally be configured such that loading the one of the set of read retry features comprises: loading the one of the set of read retry features in a scratch space of the memory array.

In Example 15, the subject matter of any one or more of Examples 13-14 may optionally be configured to include defaulting to the custom read retry feature, if loaded, to recover data.

In Example 16, the subject matter of any one or more of Examples 13-15 may optionally be configured such that the set of read retry features includes a set of read retry offset settings.

In Example 17, the subject matter of any one or more of Examples 13-16 may optionally be configured such that recovering data corresponding to the first read request comprises: determining an optimal read retry offset setting from the set of read retry offset settings to recover data in the read data corresponding to the first read request; and loading the one of the set of read retry features as the custom read retry feature comprises: loading the determined optimal read retry offset setting to recover data in the read data corresponding to the first read request as the custom read retry feature.

In Example 18, the subject matter of any one or more of Examples 13-17 may optionally be configured such that the set of read retry features includes first and second read retry offset settings, recovering data corresponding to the first read request comprises: determining if one of the first and second read retry offset settings recovers the detected error, and loading the one of the set of read retry features comprises: loading the determined one of the first and second read retry offset settings as a custom read retry feature.

In Example 19, the subject matter of any one or more of Examples 13-18 may optionally be configured to comprise: receiving a second read request; reading data from the memory array corresponding to the second read request; determining if the read data corresponding to the second read request includes a detectable error; in response to a detected error in the read data corresponding to the second read request, attempting to recover data corresponding to the second read request using the custom read retry feature before attempting to recover data using the set of read retry features.

In Example 20, subject matter (e.g., a method) to recover data from a memory array may comprise: storing a custom read retry feature in a scratch space of the memory array; determining if read data corresponding to a read request includes a detectable error; and recovering data from a detected error in the read data corresponding to the read request using the custom read retry feature stored in the scratch space of the memory array.

In Example 21, the subject matter of Example 20 may optionally be configured such that receiving the custom read retry feature prior to storing the custom read retry feature in the scratch space of the memory array.

In Example 22, the subject matter of any one or more of Examples 20-21 may optionally be configured such that determining an optimal read retry feature for read data associated with a first read command, wherein storing the custom read retry feature comprises: storing the determined optimal read retry feature for read data associated with the first read command as the custom read retry feature in the scratch space of the memory array, and wherein recovering data from the detected error comprises: recovering data from a detected error in read data associated with a second read command, subsequent to the first read command, using the custom read retry feature stored in the scratch space of the memory array.

In Example 23, the subject matter of any one or more of Examples 20-22 may optionally be configured such that recovering data from the detected error comprises: attempting to recover data from the detected error using the custom read retry feature before attempting to recover data from the detected error using one of a set of read retry features stored in registers separate from the scratch space of the memory array.

In Example 24, the subject matter of any one or more of Examples 20-23 may optionally be configured such that storing a set of read retry offsets for error correction in read retry offset registers, separate from the scratch space.

In Example 25, subject matter (e.g., a system or apparatus) may optionally combine any portion or combination of any portion of any one or more of Examples 1-24 to comprise "means for" performing any portion of any one or more of the functions or methods of Examples 1-24, or a "non-transitory machine-readable medium" including instructions that, when performed by a machine, cause the machine to perform any portion of any one or more of the functions or methods of Examples 1-24.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory device comprising:
a memory array having multiple blocks of memory cells; and
a memory controller operably coupled to the memory array, the memory controller configured to perform operations comprising:
in response to a detected error in data stored on the memory array corresponding to a memory operation, recover data corresponding to the detected error using one of a set of read offset values; and
load the one of the set of read offset values used to recover data corresponding to the detected error in a scratch space of the memory array as a custom read offset value for a subsequent memory operation.

2. The memory device of claim 1, wherein the scratch space is space in the memory array dedicated for temporary storage.

3. The memory device of claim 2, wherein the memory array comprises read retry offset registers, and
wherein the scratch space is separate from the read retry offset registers.

4. The memory device of claim 1, wherein the memory controller is configured to perform operations comprising:
default to the custom read offset value, if loaded, to recover data for the subsequent memory operation.

5. The memory device of claim 1, wherein the memory operation comprises a first read request,
wherein the memory controller is configured to perform operations further comprising:
receive the first read request;
read data from the memory array corresponding to the first read request; and
determine if the read data corresponding to the first read request includes a detectable error,
wherein the detected error in data stored on the memory array comprises the detectable error in the read data corresponding to the first read request.

6. The memory device of claim 5, wherein to recover data corresponding to the detected error comprises to recover data corresponding to the first read request using the one of the set of read offset values.

7. The memory device of claim 5, wherein the subsequent memory operation comprises a second read request subsequent to the first read request.

8. The memory device of claim 7, wherein the memory controller is configured to perform operations further comprising:
receive the second read request;
read second data from the memory array corresponding to the second read request;
determine if the read second data corresponding to the second read request includes a detectable error; and
in response to a detected error in the read second data corresponding to the second read request, attempt to recover data corresponding to the second read request using the custom read offset values before attempting to recover data using the set of read offset values.

9. The memory device of claim 1, wherein to recover data corresponding to the detected error comprises to determine an optimal read retry offset value from the set of read offset values to recover data corresponding to the detected error, and
wherein to load the one of the set of read offset values as the custom read offset value comprises to load the determined optimal read retry offset value as the custom read offset value.

10. The memory device of claim 1, wherein the set of read offset values includes first and second read retry offset values,
wherein to recover data corresponding to the detected error comprises to determine if one of the first and second read retry offset values recovers data corresponding to the detected error, and
wherein to load the one of the set of read offset values as the custom read offset value comprises to load the determined one of the first and second read retry offset values as the custom read offset value.

11. A memory device comprising:
a memory array having multiple blocks of memory cells; and
a memory controller operably coupled to the memory array, the memory controller configured to perform operations comprising:
store a custom read offset value in a temporary storage of the memory array;
determine if data stored on the memory array corresponding to a memory operation includes a detectable error; and
recover data corresponding to the detectable error using the custom read offset value stored in the temporary storage of the memory array,
wherein the memory device comprises read retry offset registers configured to store a set of read offset values for error correction, wherein the temporary storage of the memory array is separate from the read retry offset registers.

12. The memory device of claim 11, wherein the memory controller is configured to perform operations comprising:
default to the custom read offset value, if loaded, to recover data corresponding to the detectable error.

13. The memory device of claim 11, wherein the memory operation comprises a first read request,
wherein the memory controller is configured to perform operations further comprising:
receive the first read request;
read data from the memory array corresponding to the first read request; and
determine if the read data corresponding to the first read request includes the detectable error.

14. The memory device of claim 11, wherein the custom read offset value comprises an optimal read retry offset value determined from the set of read offset values stored in the read retry offset registers of the memory device to recover data from a detectable error in data corresponding to a previous memory operation.

15. The memory device of claim 11, wherein the set of read offset values includes first and second read retry offset values, and
wherein the custom read offset value comprises one of the first and second read retry offset values used to recover data from a detectable error in data corresponding to a previous memory operation.

16. The memory device of claim 11, wherein the memory controller is configured to perform operations comprising:
receive the custom read offset value prior to storing the custom read offset value in the temporary storage of the memory array,
wherein the temporary storage of the memory array is scratch space dedicated in the memory array for temporary storage separate from the read retry offset registers.

17. The memory device of claim 11, wherein to recover data corresponding to the detectable error comprises to attempt to recover data corresponding to the detectable error using the custom read value before attempting to recover data from the detectable error using one of the set of read offset values stored in the read retry offset registers separate from the temporary storage of the memory array.

18. A memory device comprising:
a memory array having multiple blocks of memory cells; and
a memory controller operably coupled to the memory array, the memory controller configured to perform operations comprising:
in response to a detected error in data stored on the memory array, recover data corresponding to the detected error using one of a set of read offset values; and
load the one of the set of read offset values used to recover data corresponding to the detected error in a temporary storage of the memory array as a custom read offset value for a subsequent memory operation.

19. The memory device of claim 18, wherein the memory array comprises read retry offset registers, and
wherein the temporary storage of the memory array is space dedicated in the memory array for temporary storage separate from the read retry offset registers.

20. The memory device of claim 19, wherein the temporary storage of the memory array comprises a scratch space of the memory array.

\* \* \* \* \*